(12) United States Patent
Joswig et al.

(10) Patent No.: US 9,054,363 B2
(45) Date of Patent: Jun. 9, 2015

(54) DEGASSING SYSTEM FOR AN ACCUMULATOR, AND ACCUMULATOR HAVING A DEGASSING SYSTEM

(75) Inventors: Ralf Joswig, Buchholz (DE); Martin Wiegmann, Borstel (DE); Helge Brenner, Hannover (DE); Edgar Kroll, Garbsen (DE); Ralf Muenster, Pollhagen (DE)

(73) Assignee: Johnson Controls Hybrid and Recycling GmbH, Hannover (DE)

( * ) Notice: Subject to any disclaimer, the term of this patent is extended or adjusted under 35 U.S.C. 154(b) by 136 days.

(21) Appl. No.: 12/875,597

(22) Filed: Sep. 3, 2010
(Under 37 CFR 1.47)

(65) Prior Publication Data

US 2011/0244278 A1 Oct. 6, 2011

Related U.S. Application Data

(63) Continuation of application No. PCT/EP2009/001371, filed on Feb. 26, 2009.

(30) Foreign Application Priority Data

Mar. 7, 2008 (DE) .......................... 10 2008 013 187

(51) Int. Cl.
*H01M 2/12* (2006.01)
*H05K 5/02* (2006.01)
(52) U.S. Cl.
CPC .......... *H01M 2/1229* (2013.01); *H05K 5/0213* (2013.01)

(58) Field of Classification Search
USPC ................................ 429/56, 53; 361/500; 96/6
See application file for complete search history.

(56) References Cited

U.S. PATENT DOCUMENTS

2001/0031390 A1* 10/2001 Schwarz .......................... 429/89

FOREIGN PATENT DOCUMENTS

| EP | 1298739 B1 | 3/2006 |
|---|---|---|
| JP | 2005197148 A | 7/2005 |

OTHER PUBLICATIONS

International Search Report with English translation for International Application No. PCT/EP2009/001371, dated Jun. 17, 2009, 6 pages.
English Translation of the Written Opinion for International Application No. PCT/EP2009/001371, dated Jun. 17, 2009, 5 pages.

* cited by examiner

*Primary Examiner* — Mark F Huff
*Assistant Examiner* — Monique Wills
(74) *Attorney, Agent, or Firm* — Fletcher Yoder, P.C.

(57) ABSTRACT

A degassing system for a housing of an accumulator includes a labyrinth bolt having a bolt wall in which a plurality of channels are provided, which extend from the bolt interior toward outlets which are arranged in an axial section of the bolt wall. The degassing system also includes a labyrinth corso having a corso wall which, in the installed state, runs around the axial section of the bolt wall such that a gap is formed in the axial section between the bolt wall and the corso wall. The degassing system further includes a gas permeable membrane, which is arranged on an upper face of the labyrinth bolt.

31 Claims, 4 Drawing Sheets

DEGASSING SYSTEM FOR AN ACCUMULATOR, AND ACCUMULATOR HAVING A DEGASSING SYSTEM

CROSS-REFERENCE TO RELATED PATENT APPLICATIONS

This application is a Continuation of International Application No. PCT/EP2009/001371, filed Feb. 26, 2009, which claims priority to German Patent Application DE 10 2008 013 187.3, filed Mar. 7, 2008. The entire disclosures of International Application No. PCT/EP2009/001371 and German Patent Application DE 10 2008 013 187.3 are incorporated by reference herein.

BACKGROUND

The invention relates to a degassing system for an accumulator, in particular for hybrid accumulators, nickel-metal-hybrid accumulators and lithium-ion accumulators.

The invention furthermore relates to an accumulator having a degassing system.

High-power accumulators with high energy densities in the electrochemical cells are used in particular in hybrid vehicles and in electrical vehicles.

The high energy densities lead to a large amount of heat being developed. In order to maintain the performance of the accumulators and to make it possible to ensure the performance in a wide operating window, effective cooling of the accumulators is necessary. It is furthermore necessary for the accumulators to have a safety system which acts in the event of overheating of the accumulators, in order in particular to prevent an explosion of the cells.

In addition to effective cooling and a safety system for protection against overheating, high-power accumulators require a safety system for protection of the accumulator against excessive gas pressure in the accumulator. The excessive gas pressure can lead to sudden reactions and to ignition of the accumulator. This can endanger people and the surrounding area.

Furthermore, the interior of the accumulators must be protected against dust and against water splashes caused, for example, by high-pressure cleaners or steam jets.

One object of the present invention is to provide a degassing system for an accumulator which on the one hand protects the interior of the accumulator against an excessive pressure, and protects it against the ingress of water splashes and dust. A further object of the present invention is to provide an accumulator whose interior is effectively protected against excessive pressure and against the ingress of water splashes and dust.

SUMMARY

An exemplary embodiment relates to a degassing system for a housing of an accumulator that includes a labyrinth bolt having a bolt wall in which a plurality of channels are provided, which extend from the bolt interior toward outlets which are arranged in an axial section of the bolt wall. The degassing system also includes a labyrinth corso having a corso wall which, in the installed state, runs around the axial section of the bolt wall such that a gap is formed in the axial section between the bolt wall and the corso wall. The degassing system further includes a gas permeable membrane, which is arranged on an upper face of the labyrinth bolt.

Another exemplary embodiment relates to an accumulator having at least one degassing system that includes a labyrinth bolt having a bolt wall in which a plurality of channels are provided, which extend from the bolt interior toward outlets which are arranged in an axial section of the bolt wall. The degassing system also includes a labyrinth corso having a corso wall which, in the installed state, runs around the axial section of the bolt wall such that a gap is formed in the axial section between the bolt wall and the corso wall. The degassing system further includes a gas permeable membrane, which is arranged on an upper face of the labyrinth bolt.

BRIEF DESCRIPTION OF THE DRAWINGS

The invention will be explained in more detail using two exemplary embodiments and with reference to the following figures, in which.

DETAILED DESCRIPTION

Figure 1:
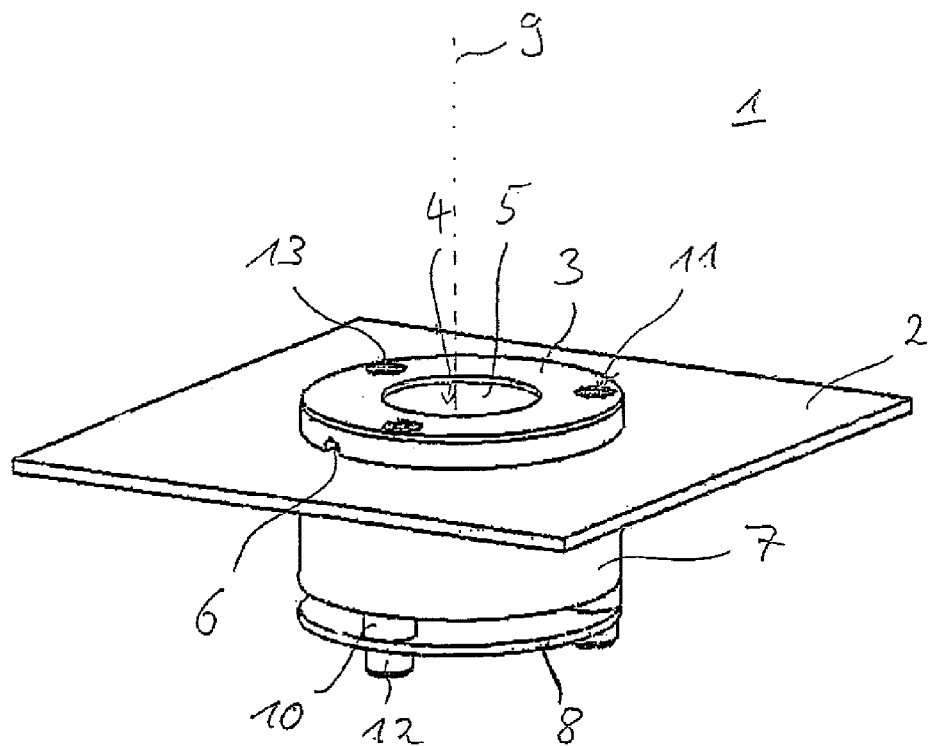
FIG. 1 shows a perspective view of a first embodiment of the degassing system according to the invention, in the installed state.

The degassing system according to the invention effectively protects an accumulator against an excessive pressure in the interior of the accumulator. An excessive pressure can be caused, for example, by overcharging of the electrochemical cells, or by a short circuit. If a relatively large amount of gas is released from the electrochemical cells into the accumulator housing, this gas is dissipated from the accumulator housing through the membrane. This effectively dissipates an excessive gas pressure (difference between the higher pressure in the accumulator interior and the ambient pressure) in the accumulator interior. If the gas pressure in the accumulator rises so severely that the excessive gas pressure exceeds a predefined value, then the membrane opens. The opening process may be reversible (for example a valve which can be closed again) or irreversible (for example tearing of the membrane). If the membrane tears, then a large amount of gas is dissipated from the accumulator within a very short time, and major excessive pressure is therefore dissipated.

Instead of a membrane, it is also possible to use a filter mesh composed of plastic with a mesh width of 5 to 100 m.

In addition to effective protection against excessive pressure in the accumulator interior, the degassing system according to the invention furthermore prevents water splashes, dust or other contamination from entering the accumulator interior from the outside. This protection is achieved in that contamination such as this from the outside would have to travel over a path which reverses a plurality of times in order to reach the accumulator interior. The reversal at the same time protects the membrane against external influences.

The protection against the ingress of water splashes or other contamination can be improved by an additional baffle plate which is arranged at a distance below the labyrinth corso. An essentially horizontally running gap, which additionally changes the direction of the path from the outside into the accumulator interior, is in this way formed between the lower face of the labyrinth corso and the upper face of the baffle plate.

The protection against the ingress of water splashes or other contamination can also be improved by providing a connecting stub for connection of a hose on the lower face of the labyrinth corso, through which the gas which emerges from accumulator interiors, and water condensation which may be formed in the accumulator, are dissipated.

In order to prevent gas from emerging in an undesirable manner on the upper face of the labyrinth corso, a seal is provided according to the invention, and is arranged on the labyrinth corso. In the installed state, the seal is expediently located between the upper face of the labyrinth corso and the base of the accumulator housing. Instead of or in addition to the seal, the degassing system can also be welded to the accumulator housing.

The degassing system preferably has essentially circular cross-sectional areas. Essentially circular cross-sectional areas can be produced easily, since both the labyrinth corso and the labyrinth bolt are in the form of a hollow cylinder, at least in places. The internal cavity can easily be produced by means of a hole.

Depending on the size of the accumulator and on the energy densities which occur, it has been found to be expedient for the channels to have cross-sectional areas of 50 $mm^2$ to 500 $mm^2$, in order to effectively dissipate excessive gas pressure in the accumulator interior.

In one special embodiment, the invention provides that the labyrinth bolt has an external thread, and the labyrinth corso has an internal thread which interacts with the external thread. This embodiment can be fitted particularly easily to a housing base of an accumulator. For this purpose, the housing base of the accumulator has an opening of suitable size. The labyrinth corso is passed through the opening in the housing base from one side (the outside), and the labyrinth bolt is passed through the opening in the housing base from the other side (the accumulator interior). The labyrinth corso and the labyrinth bolt are then tightly screwed to one another. The housing base in then held firmly, in the installed state, between the labyrinth corso and the labyrinth bolt, possibly with an additional seal.

In a further embodiment, the degassing system has at least one partial hole, through which components of the degassing system can be connected to one another by means of a screw connection. This embodiment allows the degassing system to be fitted from one side of the housing base of the accumulator. For this purpose, all the components are passed in the correct sequence from one side to the housing base. The housing base has at least one corresponding hole. A screw is passed through the at least one hole through the degassing system and through the at least one hole in the housing base of the accumulator, and is provided with a suitable nut on the other side of the housing base. A plurality of holes and screw connections are preferably provided, for example three holes arranged essentially at equal intervals around the opening in the housing base.

In addition to the screw connections mentioned above, the invention also provides for the degassing system to be welded to the housing base of the accumulator. In this case, there is no need for the seal.

FIG. 1 shows a first embodiment of a degassing system 1 according to the invention, in the installed state.

A detail of a housing base 2 of an accumulator is shown. FIG. 1 shows the upper face of the housing base 2 toward the accumulator interior, and the side of the housing base 2 on the outside, that is to say associated with the area surrounding the accumulator.

The degassing system 1 is essentially circular-cylindrical. An upper face 3 of a labyrinth bolt is directed into the accumulator interior. The upper face 3 of the labyrinth bolt is essentially in the form of a hollow cylinder with an annular cross-sectional area. The upper face 3 of the labyrinth bolt in consequence has a central, circular opening 4. The opening 4 is closed by a membrane 5. The upper face 3 of the labyrinth bolt has outlet channels 6 which run radially on its periphery. The outlet channels 6 have an essentially semicircular cross section and are used to dissipate water condensation or liquid condensation which gathers in the accumulator interior. FIG. 1 shows an outlet channel 6. However, overall, three outlet channels 6 are provided along the periphery of the upper face 3 of the labyrinth bolt and are arranged at equal intervals from one another (that is to say with an angular separation of 120° C.). A labyrinth corso 7 can be seen under the housing base.

The labyrinth corso has a cylindrical envelope surface.

A baffle plate 8 is arranged under the labyrinth corso 7. The baffle plate is arranged under the labyrinth corso 7 in the axial direction (with respect to an axis 9). The constant distance above the cross-sectional area of the baffle plate 9 is ensured by spacers 10. The spacers 10 are in the form of hollow cylinders.

The degassing system 1 is fixed to the housing base 2 via three screw connections 11. The screw connections are arranged with constant angular intervals between them and each have a screw 12 and a nut 13.

Three paraxial holes are provided through the components of the degassing system 1, for the screw connection.

Figure 2:
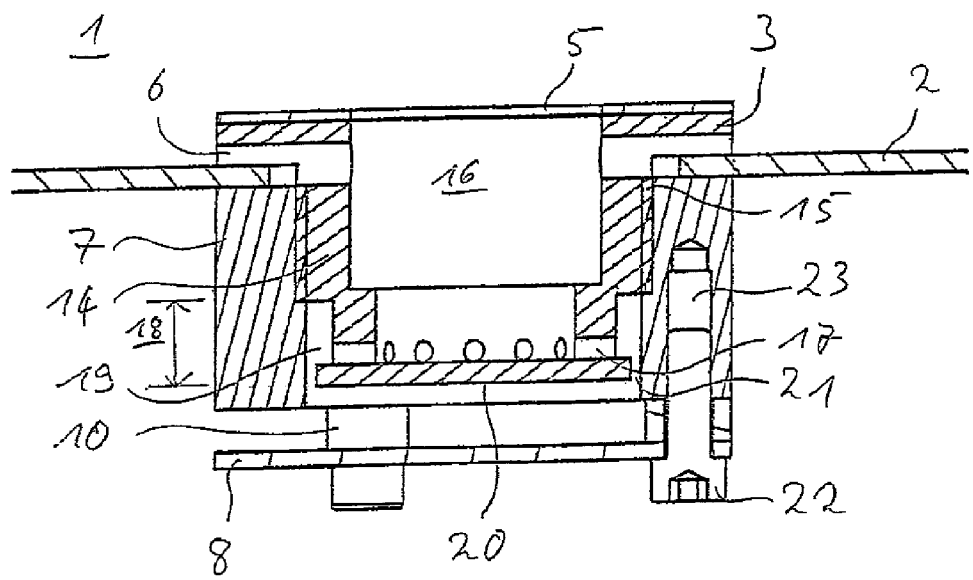
FIG. 2 shows a section view of the first embodiment as shown in FIG. 1.

FIG. 2 shows an embodiment of the degassing system 1 according to the invention which is similar to the embodiment shown in FIG. 1, but in which the degassing system 1 is fixed to the housing base 2 differently. Corresponding components are provided with the same reference numbers as in FIG. 1.

Instead of a screw connection, the labyrinth corso 7 and the labyrinth bolt 14 are detachably connected to one another via an interacting thread 15. The labyrinth bolt 14 has an external thread, and the labyrinth corso 7 an internal thread, for this threaded connection.

A cavity 16 is formed within the labyrinth bolt 14 and is separated in the axial direction from the accumulator interior by the membrane 5. Channels 17 extend in the radial direction (with respect to the axis 9) from the cavity 16. A plurality of channels 17 are provided.

The gap 19, which is aligned essentially vertically and runs in an annular shape, is formed in an axial section 18 between the labyrinth corso 7 and the labyrinth bolt 14. The channels 17 open in these gaps 19. The channels 17 and the gap 19 result in a gas-permeable connection from the area surrounding the accumulator via the cavity 16 into the accumulator interior.

A base 20 of the labyrinth bolt 14 extends somewhat further outward in the radial direction than the section above it, as a result of which the gap 19 becomes narrower in a lower area 21. This improves the protection against the ingress of water splashes or other contamination.

In this embodiment, the baffle plate 8 is fixed to the labyrinth corso 7 by a screw 22. For this purpose, the labyrinth corso has a threaded hole 23.

Figure 3:
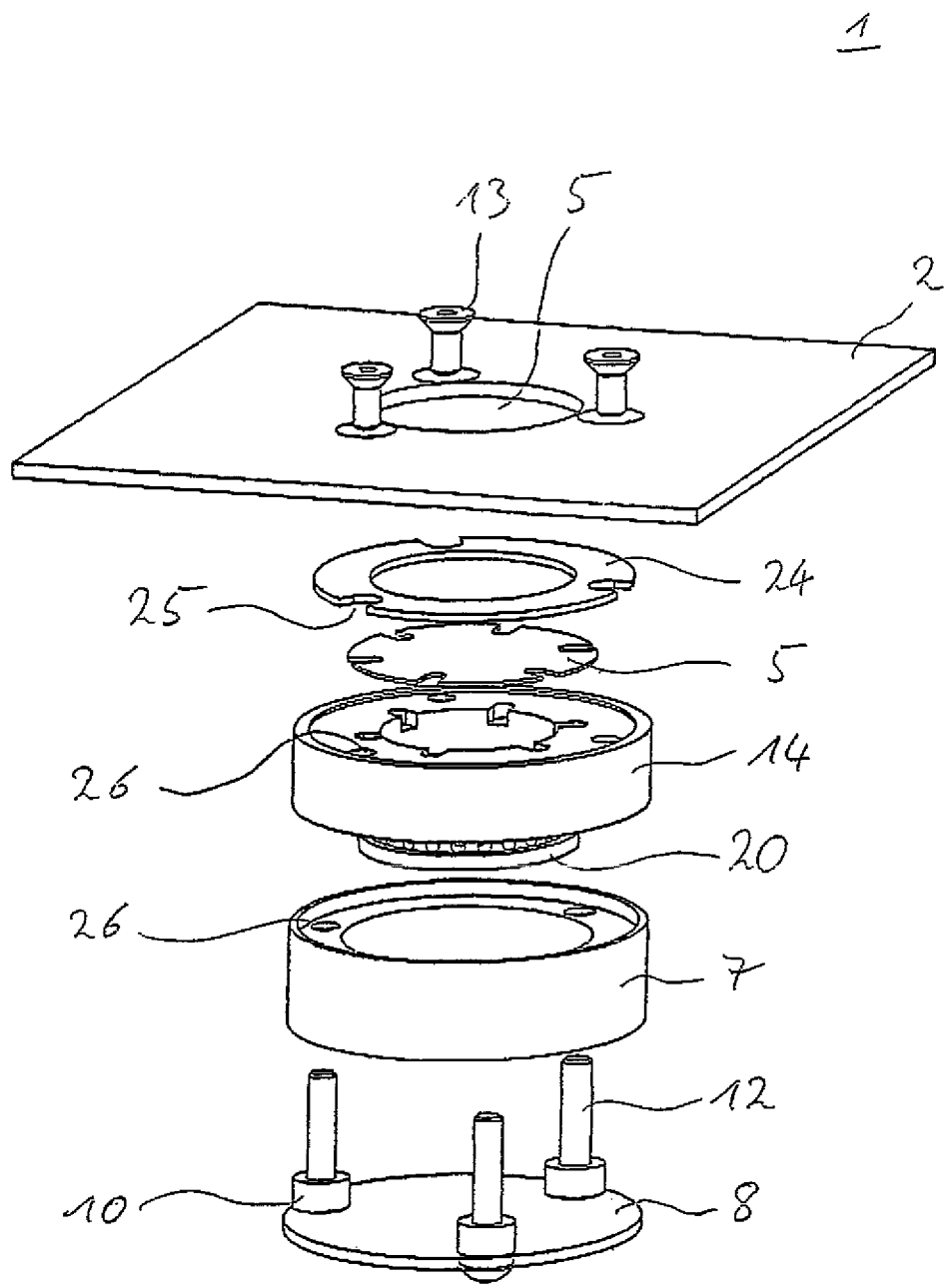
FIG. 3 shows an exploded view of a second embodiment of the degassing system according to the invention.

FIG. 3 shows an exploded view of a further embodiment of the degassing system 1 according to the invention. This degassing system is fitted to the housing base 2 completely from the outside (from underneath in the figure) with respect to the housing base 2.

A seal is arranged between the housing base 2 and the labyrinth bolt 14. The seal 25 has an essentially annular shape. The seal 25 has three recesses 26 which extend radially inward and through which the screws 12 and the nuts 13 are partially passed.

Holes 26 can be seen both through the labyrinth corso 7 and through the labyrinth bolt 14. The holes 26 (in each case three arranged with the same angular separation between them) are used to pass the screws 12 through during assembly.

Figure 4:
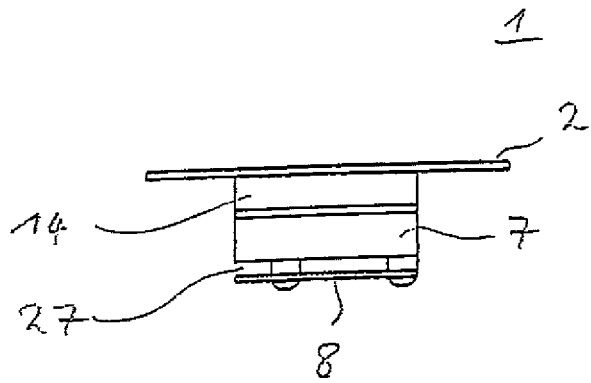
FIG. 4 shows a side view of the second embodiment in the installed state.

In FIG. 4, the embodiment shown in FIG. 3 has been produced in the installed state.

As can be seen, a gap 27 which passes essentially radially outward is formed between the baffle plate 8 and the labyrinth corso 7.

Figure 5:
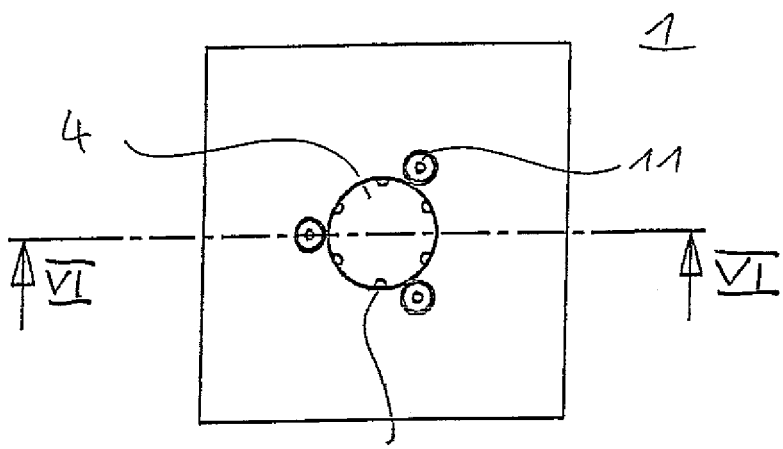
FIG. 5 shows a plan view of the second embodiment in the installed state.

FIG. 5 illustrates a plan view (that is to say seen from the accumulator interior) of the degassing system 1 shown in FIG. 4.

The opening 4 can be seen, which is covered in front of the membrane (which cannot be seen in FIG. 5).

Furthermore, the three screw connections 11 can be seen. Finally, six outlet channels 6 can be seen.

Figure 6:
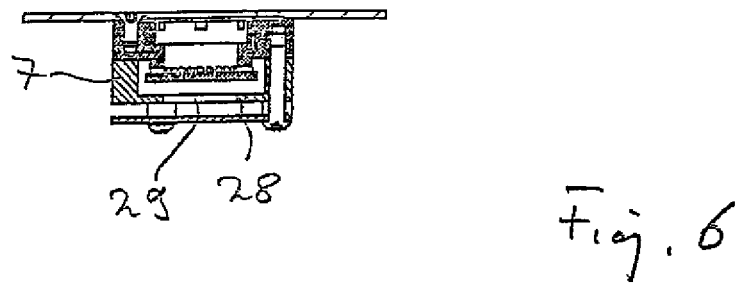
FIG. 6 shows a section view of the second embodiment in the installed state.

FIG. 6 shows the embodiment from FIG. 5 in a section view in the direction VI shown in FIG. 5.

As can be seen, a base 28 of the labyrinth corso 7 extends somewhat inward radially, as a result of which a path from the outside to the inside undergoes an additional direction change. The base 28 has an annular shape, with an opening 29.

Figure 7:
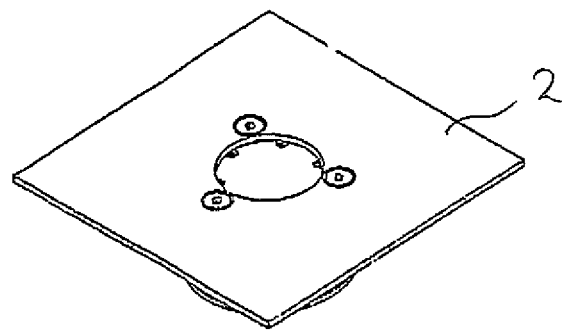
FIG. 7 shows a perspective plan view of the second embodiment in the installed state.

FIG. 7 shows a perspective plan view of the embodiment shown in FIG. 5.

Figure 8:
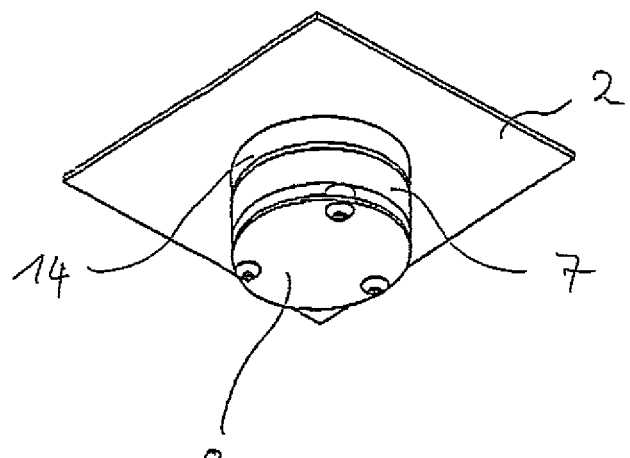
FIG. 8 shows a perspective view, from underneath, of the second embodiment in the installed state (from underneath).

FIG. 8 shows a perspective view from underneath of the embodiment shown in FIG. 7.

What is claimed is:

1. A degassing system for a housing of an accumulator, wherein the degassing system comprises:
   a labyrinth bolt having an open upper face and having a bolt wall in which a plurality of channels are provided, which extend from an open interior of the bolt toward outlets which are arranged substantially radially about the bolt wall;
   a labyrinth corso having a corso wall which, in the installed state, surrounds the bolt wall such that a gap is formed between the bolt wall and the corso wall; and
   a gas permeable membrane disposed on the open upper face of the labyrinth bolt.

2. The degassing system of claim 1, further comprising a baffle plate which, in the installed state, is arranged at a distance below the labyrinth corso.

3. The degassing system of claim 1, wherein the gas permeable membrane is configured to open when there is a predefined pressure difference across the membrane.

4. The degassing system of claim 1, wherein the gas permeable membrane is in the form of an open filter mesh.

5. The degassing system of claim 1, further comprising a seal which, in the installed state, is arranged on the labyrinth bolt.

6. The degassing system of claim 1, wherein the degassing system has an essentially circular cross sectional area.

7. The degassing system of claim 1, wherein the channels have cross sectional areas of 50 mm$^2$ to 500 mm$^2$.

8. The degassing system of claim 1, wherein the labyrinth bolt has an external thread, and the labyrinth corso has an internal thread which interacts with the external thread.

9. The degassing system of claim 1, wherein the degassing system has at least one hole parallel to a central axis of the bolt, through which components of the degassing system can be connected to one another by means of screw connection.

10. An accumulator comprising:
    at least one degassing system comprising:
    a labyrinth bolt having an open upper face and having a bolt wall in which a plurality of channels are provide, which extend from the bolt interior toward outlets which are arranged substantially radially about the bolt wall;
    a labyrinth corso having a corso wall which, in the installed state, runs around the axial section of the bolt wall such that a gap is formed in the axial section between the bolt wall and the corso wall; and
    a gas permeable membrane, disposed on the open upper face of the labyrinth bolt.

11. The accumulator of claim 10, further comprising a baffle plate which, in the installed state, is arranged at a distance below the labyrinth corso.

12. The accumulator of claim 10, wherein the gas permeable membrane is configured to open when there is a predefined pressure difference across the membrane.

13. The accumulator of claim 10, wherein the gas permeable membrane is in the form of an open filter mesh.

14. The accumulator of claim 10, further comprising a seal which, in the installed state, is arranged on the labyrinth bolt.

15. The accumulator of claim 10, wherein the at least one degassing system has an essentially circular cross sectional area.

16. The accumulator of claim 10, wherein the channels have cross sectional areas of 50 mm$^2$ to 500 mm$^2$.

17. The accumulator of claim 10, wherein the labyrinth bolt has an external thread, and the labyrinth corso has an internal thread which interacts with the external thread.

18. The accumulator of claim 10, wherein the degassing system has at least one hole parallel to the axis, through which components of the degassing system can be connected to one another by means of a screw combination.

19. The accumulator of claim 10, wherein the a least one degassing system is provide in a housing base of the accumulator.

20. The accumulator of claim 19, wherein the at least one degassing system is welded to the housing base.

21. The accumulator of claim 10, wherein the labyrinth bolt is arranged completely below the housing base.

22. The accumulator of claim 10, wherein the labyrinth bolt is arranged completely above the housing base.

23. A degassing system for a housing of an accumulator, wherein the degassing system comprises:
    a bolt having an open top portion and a closed bottom portion with a generally hollow interior defining a bolt wall, wherein the bolt comprises a plurality of channels extending substantially radially through the bolt wall;
    a cylindrical member that surrounds at least a portion of the bolt wall such that there is a gap between an outer surface of the bolt wall and an inner surface of the cylindrical member, and wherein the plurality of channels and the gap are fluidly connected; and
    a gas permeable membrane disposed to cover the open top portion of the bolt.

24. The degassing system of claim 23, comprising a baffle plate disposed below the cylindrical member.

25. The degassing system of claim 23, wherein the gas permeable membrane is configured to open when a pressure inside the accumulator reaches a predetermined limit.

26. The degassing system of claim 23, wherein the gas permeable membrane comprises an open filter mesh.

27. The degassing system of claim 23, comprising a seal disposed on the bolt.

28. The degassing system of claim 23, wherein the degassing system comprises a generally circular cross sectional area.

29. The degassing system of claim 23, wherein the channels have cross sectional areas of 50 mm$^2$ to 400 mm$^2$.

30. The degassing system of claim 23, wherein the outer surface of the bolt wall comprises an external thread, and the inner surface of the cylindrical member comprises an internal thread, and the internal thread and the external thread are configured to interact to couple the bolt to the cylindrical member.

31. The degassing system of claim 23, comprising one or more holes extending parallel to a central axis of the bolt, such that a coupling device may extend through the one or more holes to couple components of the degassing system.

* * * * *